US009614271B2

(12) United States Patent
Nakano et al.

(10) Patent No.: US 9,614,271 B2
(45) Date of Patent: Apr. 4, 2017

(54) COMPOSITE MODULE AND ELECTRONIC APPARATUS INCLUDING THE SAME

(71) Applicant: Murata Manufacturing Co., Ltd., Nagaokakyo-shi, Kyoto-fu (JP)

(72) Inventors: Morihiro Nakano, Nagaokakyo (JP); Yuichi Ito, Nagaokakyo (JP); Taro Hirai, Nagaokakyo (JP); Hidetaka Kuwahara, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 343 days.

(21) Appl. No.: 14/010,790

(22) Filed: Aug. 27, 2013

(65) Prior Publication Data

US 2014/0091983 A1 Apr. 3, 2014

(30) Foreign Application Priority Data

Sep. 28, 2012 (JP) ................................ 2012-217180

(51) Int. Cl.

| | |
|---|---|
| ***H01Q 1/50*** | (2006.01) |
| ***H05K 7/00*** | (2006.01) |
| ***H05K 9/00*** | (2006.01) |
| ***H01Q 1/24*** | (2006.01) |
| ***H01Q 1/52*** | (2006.01) |

(52) U.S. Cl.

CPC ................. *H01Q 1/24* (2013.01); *H01Q 1/52* (2013.01); *H01Q 1/243* (2013.01)

(58) Field of Classification Search

CPC ............... H01Q 1/2291; H01Q 1/2283; H01R 2201/02; H01R 2201/06

USPC ........ 343/906, 904, 878; 361/760, 904, 878; 174/350–377

See application file for complete search history.

(56) References Cited

U.S. PATENT DOCUMENTS

2003/0193794 A1 10/2003 Reis et al.
2005/0045358 A1* 3/2005 Arnold ................ H05K 9/0024 174/51
2007/0096997 A1* 5/2007 Nishikawa ............ G06F 1/1616 343/702
2009/0040117 A1* 2/2009 Miyaura .............. H05K 1/0295 343/702
2009/0168386 A1 7/2009 Suzuki et al.
2010/0315787 A1* 12/2010 Li ...................... H01L 23/3677 361/709

(Continued)

FOREIGN PATENT DOCUMENTS

JP 63-040400 A 2/1988
JP 3-292799 A 12/1991

(Continued)

OTHER PUBLICATIONS

Official Communication issued in corresponding Japanese Patent Application No. 2012-217180, mailed on Aug. 5, 2014.

*Primary Examiner* — Graham Smith
*Assistant Examiner* — Collin Dawkins
(74) *Attorney, Agent, or Firm* — Keating & Bennett, LLP

(57) ABSTRACT

A wireless communication module includes a circuit board, and an antenna and a connection member mounted on a mounting surface of the circuit board. The antenna is mounted in a region along a first end edge of the circuit board, and the connection member is mounted in a region along a second end edge of the circuit board.

15 Claims, 3 Drawing Sheets

(56) References Cited

U.S. PATENT DOCUMENTS

| | | | | |
|---|---|---|---|---|
| 2011/0068994 | A1* | 3/2011 | Matsuoka | H01Q 1/2266 343/841 |
| 2011/0188216 | A1* | 8/2011 | Ju | H05K 7/00 361/760 |
| 2011/0294553 | A1* | 12/2011 | Patil | H04B 1/525 455/571 |
| 2011/0298665 | A1* | 12/2011 | Wu | H01Q 1/088 343/700 MS |

FOREIGN PATENT DOCUMENTS

| | | | |
|---|---|---|---|
| JP | 8-236893 | A | 9/1996 |
| JP | 8-330699 | A | 12/1996 |
| JP | 09-500246 | A | 1/1997 |
| JP | 2000-91884 | A | 3/2000 |
| JP | 2000-277976 | A | 10/2000 |
| JP | 2001-77612 | A | 3/2001 |
| JP | 2003-031987 | A | 1/2003 |
| JP | 2003-202811 | A | 7/2003 |
| JP | 2005-175667 | A | 6/2005 |
| JP | 2006-513556 | A | 4/2006 |
| JP | 2007-115901 | A | 5/2007 |
| JP | 2008-235775 | A | 10/2008 |
| JP | 2009-094175 | A | 4/2009 |
| JP | 2009-112062 | A | 5/2009 |
| JP | 2009-158838 | A | 7/2009 |
| JP | 2009-182385 | A | 8/2009 |
| JP | 2010-10524 | A | 1/2010 |
| JP | 2010-258789 | A | 11/2010 |
| JP | 2012-79468 | A | 4/2012 |

* cited by examiner

FIG. 1
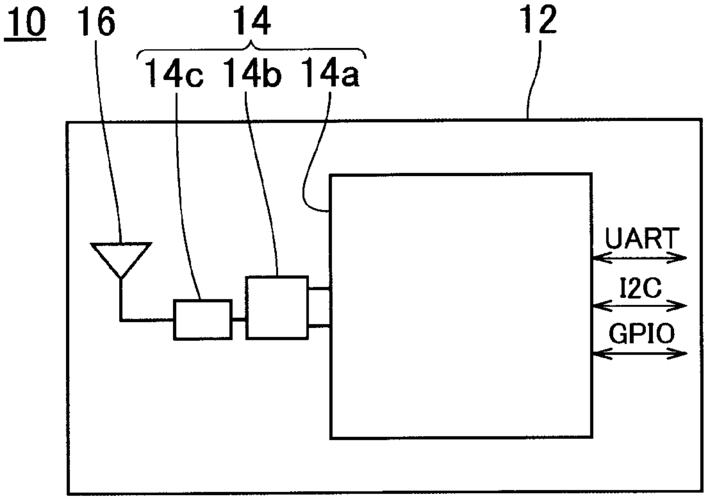
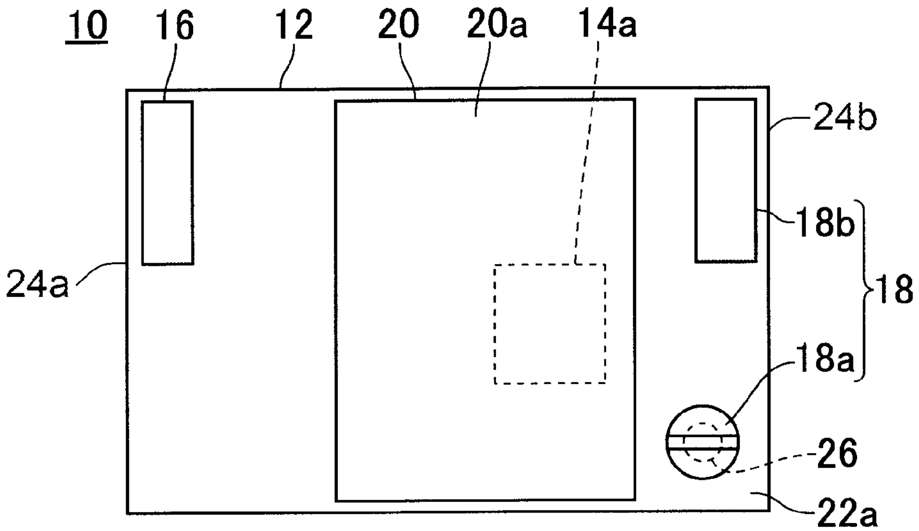
FIG. 2A
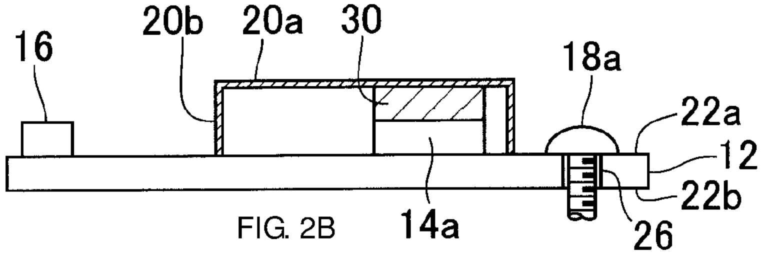
FIG. 2B

COMPOSITE MODULE AND ELECTRONIC APPARATUS INCLUDING THE SAME

BACKGROUND OF THE INVENTION

1. Field of the Invention

The present invention relates to a composite module and an electronic apparatus including the same, and particularly, relates to a wireless communication module preferably for use in a wireless communication apparatus and in which an electronic component element is mounted, and an electronic apparatus including the same.

2. Description of the Related Art

Japanese Unexamined Patent Application Publication No. 2000-091884 describes an electronic circuit apparatus that includes a substantially square case and in which a circuit board is connected to a metal plate by screws. The square case described in Japanese Unexamined Patent Application Publication No. 2000-091884 is arranged for the purpose of protecting a smoothing capacitor and the like, and also serves as a shield case by being connected also to a conductive pattern mounted on the circuit board.

Meanwhile, in the electronic circuit apparatus described in Japanese Unexamined Patent Application Publication No. 2000-091884, an antenna may be arranged and connected to a component such as an IC mounted within the circuit board or on the board. In this case, when the antenna is arranged near the shield case or near a screw for fixing the metal plate, the radiation characteristics of the antenna are disrupted, and desired radiation characteristics are not achieved. In addition, heat dissipation characteristics by the screw are deteriorated when the screw is spaced away from a heat dissipation member. Such a problem of the characteristics of the module being deteriorated occurs significantly when the circuit board is small in size.

SUMMARY OF THE INVENTION

Accordingly, preferred embodiments of the present invention provide a composite module that suppresses deterioration or the like of the characteristics of the composite module or an electronic component element mounted in the module by preventing deterioration of the radiation characteristics of an antenna mounted in the composite module and efficiently dissipating heat generated in the composite module.

According to a preferred embodiment of the present invention, a composite module includes a circuit board, and an antenna and a connection member mounted on a mounting surface of the circuit board. The antenna is mounted in a region along a first end edge of the circuit board, and the connection member is mounted in a region along a second end edge of the circuit board.

With this configuration, it is possible to mount the connection member having an effect on the performance of the antenna, on the circuit board such that the connection member is spaced away from the antenna. Thus, it is possible to minimize deterioration of the performance of the antenna and the effects on the directivity of the antenna.

In addition, in the composite module according to a preferred embodiment of the present invention, the connection member is preferably at least a fixing member or a connection connector.

With this configuration, the composite module is able to efficiently dissipate heat at least via the fixing member.

Furthermore, preferably, the composite module according to a preferred embodiment of the present invention includes an electronic component element mounted on the circuit board, and a metal case mounted on the circuit board so as to cover the electronic component element, and the metal case is mounted in a region on the second end edge side of the circuit board.

With this configuration, it is possible to mount the metal case having an effect on the performance of the antenna, on the circuit board such that the metal case is spaced away from the antenna. Thus, it is possible to further suppress deterioration of the performance of the antenna and the effect on the directivity of the antenna.

In addition, preferably, the composite module according to a preferred embodiment of the present invention includes an electronic component element mounted on the circuit board, and a metal case mounted on the circuit board so as to cover the electronic component element, the first end edge and the second end edge are opposed to each other when the circuit board is seen in a planar view, the metal case is mounted in a region on the second end edge side of the circuit board, the metal case includes a top plate and a side plate arranged at a predetermined position, and the fixing member is arranged near a portion where the side plate is not arranged.

With this configuration, it is possible to block an unwanted signal leaking out through the portion where there is no side plate of the metal case, or an unwanted signal entering into the inside of the metal case from the outside, by the fixing member.

In addition, in the composite module according to a preferred embodiment of the present invention, the fixing member is preferably arranged at a position such that the fixing member is covered with the metal case.

With this configuration, it is possible to significantly reduce or prevent deterioration of the radiation characteristics of the antenna that is caused by the fixing member. In addition, heat from the electronic component element which generates heat tends to be transferred to the fixing member. Thus, it is possible to enhance the heat dissipation effect of the composite module.

Furthermore, in the composite module according to a preferred embodiment of the present invention, a heat dissipation member is preferably arranged between the metal case and the electronic component element.

With this configuration, it is possible to efficiently absorb heat from the electronic component element which generates heat, and it is possible to dissipate the heat from the heat dissipation member to the metal case. Thus, it is possible to further enhance the heat dissipation effect of the composite module.

Furthermore, according to a preferred embodiment of the present invention, an electronic apparatus includes a mother board, and the composite module according to one of the other preferred embodiments of the present invention, the composite module being mounted on the mother board by the fixing member.

With this configuration, it is possible to dissipate heat from the electronic component element, which is mounted in the composite module, via the circuit board and the fixing member to the mother board. Thus, it is possible to enhance the heat dissipation effect of the electronic apparatus.

In addition, in the electronic apparatus according to a preferred embodiment of the present invention, the metal case or the mounting surface is preferably mounted so as to face a principal surface side of the mother board.

With this configuration, it is possible to dissipate heat from the electronic component element, which is mounted in the composite module, via the circuit board and the fixing member to the mother board, and further it is possible to dissipate the heat from the electronic component element via the metal case to the mother board. Thus, it is possible to further enhance the heat dissipation effect of the electronic apparatus.

Furthermore, in the electronic apparatus according to a preferred embodiment of the present invention, a heat dissipation member is preferably arranged between the top plate of the metal case and a principal surface of the mother board.

With this configuration, it is possible to dissipate heat from the electronic component element, which is mounted in the composite module, via the circuit board and the fixing member to the mother board, and further it is possible to absorb the heat from the electronic component element by the heat dissipation member via the metal case and then dissipate the heat to the mother board. Thus, it is possible to further enhance the heat dissipation effect of the electronic apparatus.

According to a preferred embodiment of the present invention, it is possible to provide a composite module that suppresses deterioration or the like of the characteristics of the composite module by preventing deterioration of the radiation characteristics of an antenna mounted in the composite module and efficiently dissipating heat generated in the composite module.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a block diagram schematically showing the configuration of a wireless communication module.

FIG. 2A is a schematic plan view of a first preferred embodiment of the wireless communication module according to the present invention.

FIG. 2B is a schematic cross-sectional view of the first preferred embodiment of the wireless communication module according to the present invention.

DETAILED DESCRIPTION OF THE PREFERRED EMBODIMENTS

Figure 3:
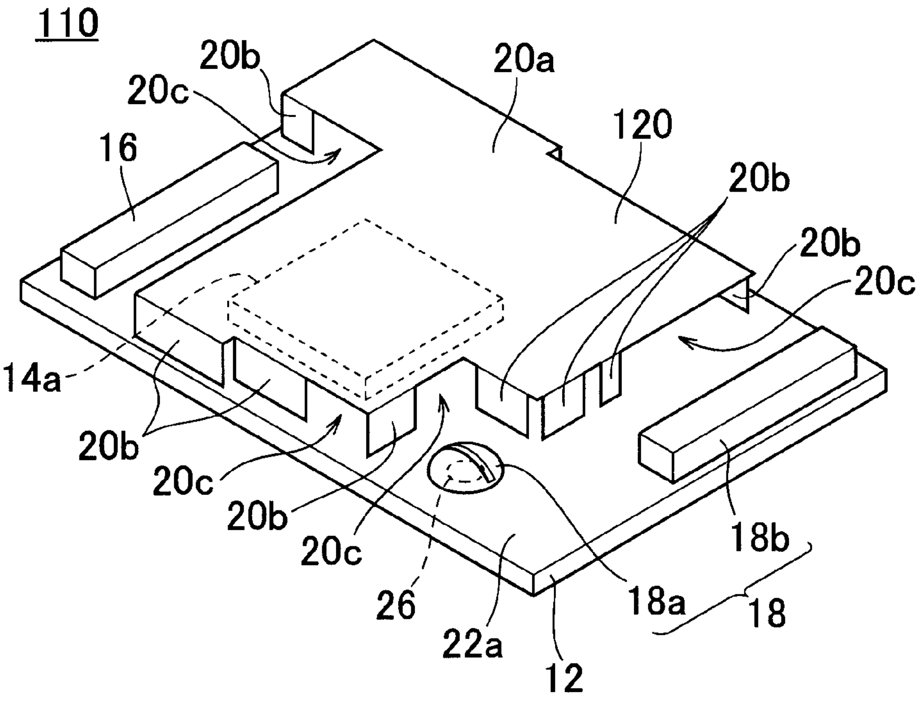
FIG. 3 is a schematic perspective view of a second preferred embodiment of the wireless communication module according to the present invention.

Example of preferred embodiments of a wireless communication module as a composite module according to the present invention will be described. FIG. 1 is a block diagram schematically showing the configuration of a wireless communication module.

A wireless communication module 10 shown in FIG. 1 includes a circuit board 12, a plurality of electronic component elements 14, an antenna 16, and a plurality of interfaces connected to a connection connector (not shown). The plurality of electronic component elements 14 include, for example, a wireless communication IC 14*a*, a balun filter 14*b* for countermeasures against spurious responses, and a band-pass filter 14*c*. In the wireless communication module 10, the wireless communication IC 14*a* is connected to the antenna 16 via the balun filter 14*b* and the band-pass filter 14*c*. It should be noted that a PA for transmission is included within the wireless communication IC 14*a*, and the PA is a main heat source. In addition, the wireless communication module 10 is connected such that communication is enabled via various interfaces such as UART (Universal Asynchronous Receiver Transmitter), I2C (Inter-Integrated Circuit), and GPIO (General Purpose Input/Output), and each interface is connected to the connection connector.

Next, FIG. 2A is a schematic plan view of a first preferred embodiment of the wireless communication module according to the present invention, and FIG. 2B is a schematic cross-sectional view of the first preferred embodiment of the wireless communication module according to the present invention. A wireless communication module 10 shown in FIGS. 2A and 2B includes at least a circuit board 12, an electronic component element 14, an antenna 16, a connection member 18, and a metal case 20.

The circuit board 12 preferably has, for example, a rectangular or substantially rectangular plate shape, and includes a principal surface 22*a* and another principal surface 22*b*. The antenna 16, the connection member 18, the electronic component element 14, and the metal case 20 are mounted on the principal surface 22*a* of the circuit board 12, and a desired wiring pattern (not shown) is further provided thereon. The antenna 16 is mounted in a region along an end edge 24*a* of the circuit board 12. In addition, the connection member 18 is mounted in a region along another end edge 24*b* of the circuit board 12. Furthermore, the circuit board 12 includes a through hole 26 to enable insertion of a fixing member 18*a* of the later-described connection member 18 therethrough. The circuit board 12 may be a printed circuit board such as a glass epoxy resin multi-layer board, or may be a ceramic multi-layer board, for example.

The electronic component element 14 is mounted on the other end edge 24*b* side in the principal surface 22*a* of the circuit board 12. Examples of the electronic component element 14 mounted on the circuit board 12 include the wireless communication IC 14*a*, the balun filter 14*b*, and the band-pass filter 14*c* as shown in FIG. 1. As described above, since the PA is included in the wireless communication IC 14*a*, the wireless communication IC 14*a* becomes a heat source. Electronic components that generate heat, such as the wireless communication IC 14*a*, are preferably mounted, particularly, on the other end edge 24*b* side in the principal surface 22*a* of the circuit board 12. In other words, particularly, electronic component elements that generate heat, such as the wireless communication IC 14*a*, are preferably arranged near the later-described connection member 18, particularly, near the fixing member 18*a*. In addition, the end edge 24*a* of the circuit board 12 and the other end edge 24*b* of the circuit board 12 are preferably opposed to each other when the circuit board 12 is seen in a planar view.

A heat dissipation member 30 is arranged on a top surface of the wireless communication IC 14*a* (namely, a surface opposite to the surface through which the wireless communication IC 14*a* is mounted on the circuit board 12). The heat dissipation member 30 is arranged between the wireless communication IC 14*a* and the metal case 20. In other words, in the heat dissipation member 30, a surface opposite to a surface that is in contact with the top surface side of the wireless communication IC 14*a* is located so as to be in contact with an inner wall surface of the metal case 20. The heat dissipation member 30 serves to absorb heat generated by the wireless communication IC 14*a* and also serves to absorb shocks applied to the wireless communication IC 14*a* and the metal case 20. In addition, the heat dissipation member 30 has a size that is large enough at least to cover the top surface of the electronic component element 14. A resin having a high thermal conductivity is preferably used as the material of the heat dissipation member 30, and, for example, a silicon resin containing a ceramic or metallic filler is preferred.

The antenna 16 has a function to transmit and receive radio waves to perform wireless communication with an external wireless communication terminal or the like. The antenna 16 is mounted in the region along the end edge 24*a* of the circuit board 12. A chip antenna preferably including a dielectric material is used as the antenna 16. It should be noted that the antenna 16 may be a pattern antenna including a wiring pattern on the circuit board. In addition, when the antenna 16 is a pattern antenna, the antenna 16 may be provided on only the principal surface 22*a* or only the principal surface 22*b* of the circuit board 12, or may be provided on both of the principal surface 22*a* and the principal surface 22*b*.

The connection member 18 is mounted in the region along the other end edge 24*b* of the circuit board 12. The connection member 18 includes the fixing member 18*a* and a connection connector 18*b*. The fixing member 18*a* has a function to mount the circuit board 12 on a mother board by using, for example, the through hole 26 provided in the circuit board 12. A member having a high thermal conductivity, such as a metal screw, is used as the fixing member 18*a*. The fixing member 18*a* is used to attach the circuit board 12, for example, to a mother board, and is also used to electrically connect to a ground electrode provided on the mother board. Meanwhile, the connection connector 18*b* has a function to electrically connect to another circuit.

The metal case 20 covers the electronic component element 14 such as the wireless communication IC 14*a* constituting an RF (transmitting/receiving circuit) portion of the wireless communication module 10, and is mounted on the circuit board 12 for protection. The metal case 20 preferably includes a top plate 20*a* and side plates 20*b* that are formed in a substantially rectangular shape when being seen in a planar view. The metal case 20 is mounted on the other end edge 24*b* side in the principal surface 22*a* of the circuit board 12 preferably via solder.

With regard to the wireless communication module 10 according to the first preferred embodiment, heat generated in the electronic component element 14 is dissipated as follows. Specifically, the heat generated in the electronic component element 14 is efficiently absorbed by the heat dissipation member 30, since the heat dissipation member 30 is preferably made of the resin having a high thermal conductivity. Subsequently, the heat absorbed by the heat dissipation member 30 is transferred to the first metal case 20. At the same time, the heat generated in the electronic component element 14 is transferred to the fixing member 18*a* arranged near the electronic component element 14. Then, the heat is transferred to a component to which the fixing member 18*a* is connected (e.g., the mother board or the ground electrode formed on the mother board).

According to the wireless communication module 10 according to a preferred embodiment of the present invention, since the antenna 16 is mounted in the region along the end edge 24*a* of the circuit board 12 and the connection member 18 is mounted in the region along the other end edge 24*b* of the circuit board 12, it is possible to mount the connection member 18 having an effect on the performance of the antenna 16, on the circuit board 12 such that the connection member 18 is spaced away from the antenna 16. In addition, since the metal case 20 is mounted on the other end edge 24*b* side of the circuit board 12, it is possible to mount the metal case 20 on the circuit board 12 such that the metal case 20 is spaced away from the antenna 16. Therefore, it is possible to significantly reduce or prevent deterioration of the performance of the antenna 16 and the effect on the directivity of the antenna 16 by the connection member 18.

In addition, according to the wireless communication module 10 according to a preferred embodiment of the present invention, since the metal case 20 is mounted on the other end edge 24*b* side of the circuit board 12, it is possible to efficiently dissipate heat generated in the electronic component element 14 (particularly, in the wireless communication IC 14*a* which generates heat), via the circuit board 12 to the connection member 18, particularly, to the fixing member 18*a*. Moreover, when the electronic component element 14 covered with the metal case 20 (particularly, the wireless communication IC 14*a* which generates heat) is mounted on the other end edge 24*b* side of the circuit board 12, it is possible to efficiently dissipate heat from the electronic component element 14 to the connection member 18, particularly, to the fixing member 18*a*. It is possible to dissipate the heat transferred to the fixing member 18*a* to, for example, the mother board on which the circuit board 12 is mounted, the ground electrode formed on the mother board, or the like.

Due to the above advantageous effects, according to the wireless communication module 10 according to a preferred embodiment of the present invention, it is possible to suppress deterioration of the characteristics of the wireless communication module 10 by preventing deterioration of the radiation characteristics of the antenna 16 and efficiently dissipating heat generated particularly in the electronic component element 14.

Next, a second preferred embodiment of the wireless communication module according to the present invention will be described. FIG. 3 is a schematic perspective view of the second preferred embodiment of the wireless communication module according to the present invention.

A wireless communication module 110 shown in FIG. 3 includes at least a circuit board 12, an electronic component element 14, an antenna 16, a connection member 18, and a metal case 120. It should be noted that the circuit board 12, the electronic component element 14, and the antenna 16 provided in the wireless communication module 110 preferably are the same or substantially the same as the circuit board 12, the electronic component element 14, and the antenna 16 provided in the wireless communication module 10 of the first preferred embodiment, and thus the description thereof is omitted.

The metal case 120 covers the electronic component element 14 such as a wireless communication IC 14*a* constituting a RF (transmitting/receiving circuit) portion of the wireless communication module 110, and is mounted on the circuit board 12 for protection. The metal case 120 preferably includes a top plate 20*a* and side plates 20*b*. In addition, in the side surfaces of the metal case 120, gaps 20*c* are located at portions where no side plate 20*b* is provided. The metal case 120 is mounted on the other end edge 24*b* side in the principal surface 22*a* of the circuit board 12 preferably via solder. Moreover, the connection member 18 includes a fixing member 18*a* and a connection connector 18*b*. The fixing member 18*a* is arranged so as to block at least one of the gaps 20*c* located in the side surfaces of the metal case 120.

In the wireless communication module 110, the same advantageous effects as those of the above-described wireless communication module 10 are provided, and the following advantageous effects are also provided.

In the case where the odd-form metal case 120 is produced by using a single metal plate, when processing the metal plate, it is necessary to create gaps at corners of a top plate and the like, and there is a concern that leakage or entry of a signal occurs at each gap 20*c* of the metal case 120. According to the wireless communication module 110 according to a preferred embodiment of the present invention, since the fixing member 18*a* such as a metal screw is arranged in the through hole 26 of the circuit board 12, it is possible to block an unwanted signal leaking out through each gap 20*c* that is a portion of the metal case 120 where there is no side plate or an unwanted signal entering into the inside of the metal case 120 from the outside, by the fixing member 18*a*. Therefore, it is possible to significantly reduce or prevent malfunctioning of the wireless communication module 110 or another electronic component.

Therefore, according to the wireless communication module 110 according to a preferred embodiment of the present invention, it is possible to further suppress deterioration of the characteristics of the wireless communication module 110 by preventing deterioration of the radiation characteristics of the antenna 16 and efficiently dissipating heat generated particularly in the electronic component element 14.

Figure 4:
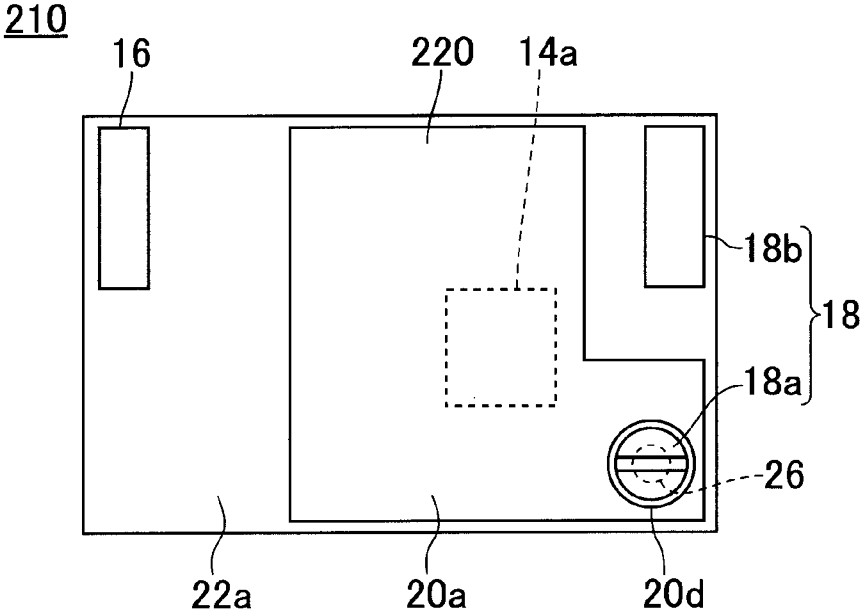
FIG. 4 is a schematic plan view of a third preferred embodiment of the wireless communication module according to the present invention.

Next, a third preferred embodiment of the wireless communication module according to the present invention will be described. FIG. 4 is a schematic plan view of the third preferred embodiment of the wireless communication module according to the present invention.

The wireless communication module 210 shown in FIG. 4 includes at least a circuit board 12, an electronic component element 14, an antenna 16, a connection member 18, and a metal case 220. It should be noted that the circuit board 12, the electronic component element 14, and the antenna 16 provided in the wireless communication module 210 preferably are the same or substantially the same as the circuit board 12, the electronic component element 14, and the antenna 16 provided in the wireless communication module 10 of the first preferred embodiment, and thus the description thereof is omitted.

The metal case 220 covers the electronic component element 14 such as a wireless communication IC 14*a* constituting an RF (transmitting/receiving circuit) portion of the wireless communication module 210, and is mounted on the circuit board 12 for protection. The metal case 220 preferably includes a top plate 20*a* and side plates 20*b*. The top plate 20*a* of the metal case 220 preferably is L-shaped or substantially L-shaped. The metal case 220 is mounted on the other end edge 24*b* side in the principal surface 22*a* of the circuit board 12 preferably via solder. In addition, the top plate 20*a* of the metal case 220 includes a hole 20*d*. The hole 20*d* is located at a position that is directly above and faces the through hole 26 located in the circuit board 12 when the metal case 220 is mounted on the principal surface 22*a* of the circuit board 12. In addition, the connection member 18 includes a fixing member 18*a* and a connection connector 18*b*. The fixing member 18*a* is arranged at such a position that the fixing member 18*a* is covered with the metal case 220.

With regard to the wireless communication module 210 according to the third preferred embodiment, heat generated in the electronic component element 14 is dissipated as follows. Specifically, the heat generated in the electronic component element 14 is efficiently absorbed by the heat dissipation member 30, since the heat dissipation member 30 is preferably made of the resin having a high thermal conductivity. Subsequently, the heat absorbed by the heat dissipation member 30 is transferred to the first metal case 220. The heat transferred to the metal case 220 is transferred to the fixing member 18*a*, since the fixing member 18*a* is arranged within the metal case 220. At the same time, the heat generated in the electronic component element 14 is transferred to the fixing member 18*a* arranged near the electronic component element 14. Then, the heat is transferred to a component to which the fixing member 18*a* is connected (e.g., the mother board or the ground electrode located on the mother board).

In the wireless communication module 210, the same advantageous effects as those of the above-described wireless communication module 10 are provided, and the following advantageous effects are also provided. Specifically, according to the wireless communication module 210 according to a preferred embodiment of the present invention, since the fixing member 18*a* arranged in the through hole 26 is arranged within the metal case 220, it is possible to reduce deterioration of the radiation characteristics of the antenna 16. In addition, since it is possible to arrange the fixing member 18*a* closer a heat dissipation component (an electronic component that generates heat) arranged within the metal case 220, the heat that is generated in the electronic component element 14 and transferred to the metal case 220 is also transferred to the fixing member 18*a*. Thus, it is possible to further enhance the heat dissipation effect of the wireless communication module 210.

Therefore, according to the wireless communication module 210 according to a preferred embodiment of the present invention, it is possible to further suppress deterioration of the characteristics of the wireless communication module 210 by preventing deterioration of the radiation characteristics of the antenna 16 and efficiently dissipating heat generated particularly in the electronic component element 14.

Figure 5:
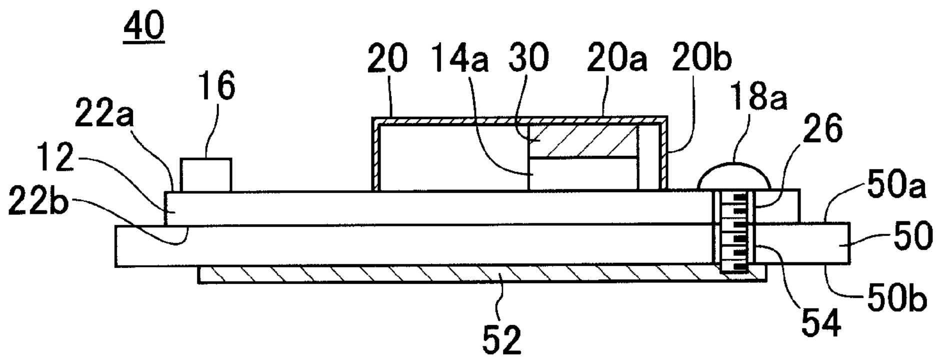
FIG. 5 is a schematic cross-sectional view of a first preferred embodiment of an electronic apparatus including the wireless communication module according to the present invention.

Next, a first preferred embodiment of an electronic apparatus including the wireless communication module according to the present invention will be described. FIG. 5 is a schematic cross-sectional view of the first preferred embodiment of the electronic apparatus including the wireless communication module according to one of the other preferred embodiments of the present invention.

An electronic apparatus 40 shown in FIG. 5 includes at least a wireless communication module 10 and a mother board 50. It should be noted that the configuration and the like of the wireless communication module 10 are the same as those of the wireless communication module 10 in FIG. 2 or the first preferred embodiment, and thus the description thereof is omitted.

The mother board 50 preferably has, for example, a plate shape or a substantially plate shape, and includes a principal surface 50*a* and another principal surface 50*b*. The wireless communication module 10 is mounted on the principal surface 50*a* of the mother board 50 via the fixing member 18*a*. At that time, the other principal surface 22*b* of the circuit board 12 and the principal surface 50*a* of the mother board 50 are in contact with each other.

In addition, a ground electrode 52 is located on the other principal surface 50*b* of the mother board 50. The mother board 50 has a through hole 54 to enable insertion of the fixing member 18*a* of the connection member 18 therethrough. Therefore, the fixing member 18*a* is mounted so as to extend through the mother board 50, and another end of the fixing member 18*a* is electrically connected to the ground electrode 52 located on the other principal surface 50*b* of the mother board 50.

With regard to the electronic apparatus 40 including the wireless communication module 10 according to the first preferred embodiment, heat generated in the electronic component element 14 is dissipated as follows. Specifically, the heated generated in the electronic component element 14 is efficiently absorbed by the heat dissipation member 30, since the heat dissipation member 30 is preferably made of the resin having a high thermal conductivity. The heat absorbed by the heat dissipation member 30 is subsequently transferred to the first metal case 20. At the same time, the heat generated in the electronic component element 14 is transferred to the fixing member 18*a* arranged near the electronic component element 14. Then, the heat is transferred to the mother board 50 or the ground electrode 52 located on the other principal surface 50*b* of the mother board 50, each of which is a component to which the fixing member 18*a* is connected.

According to the electronic apparatus 40 including the wireless communication module 10 according to a preferred embodiment of the present invention, since it is possible to dissipate the heat generated in the electronic component element 14, via the fixing member 18*a* to the mother board 50, it is possible to enhance the heat dissipation effect of the electronic apparatus 40.

Figure 6:
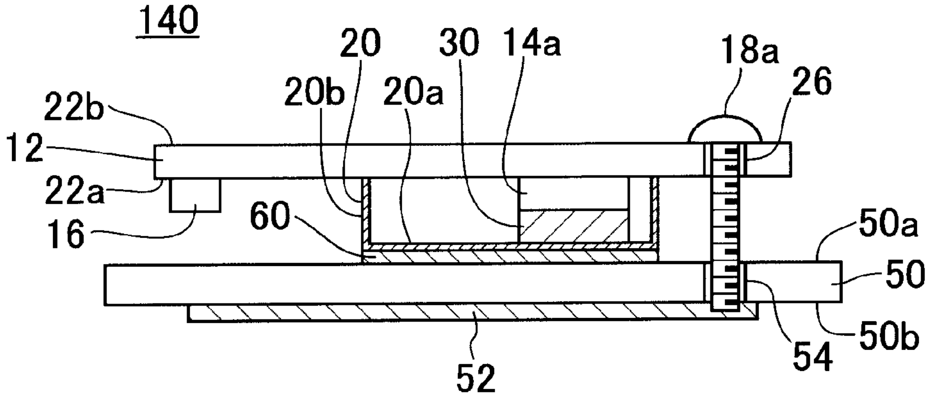
FIG. 6 is a schematic cross-sectional view of a second preferred embodiment of the electronic apparatus including the wireless communication module according to the present invention.

Next, a second preferred embodiment of the electronic apparatus including the wireless communication module according to a preferred embodiment of the present invention will be described. FIG. 6 is a schematic cross-sectional view of the second preferred embodiment of the electronic apparatus including the wireless communication module according to a preferred embodiment of the present invention.

An electronic apparatus 140 shown in FIG. 6 includes at least a wireless communication module 10 and a mother board 50. It should be noted that the configuration and the like of the wireless communication module 10 are the same as those of the wireless communication module 10 in FIG. 2 or the first preferred embodiment, and thus the description thereof is omitted.

The mother board 50 preferably has, for example, a plate shape or a substantially plate shape, and includes a principal surface 50*a* and another principal surface 50*b*. The wireless communication module 10 is mounted on the principal surface 50*a* of the mother board 50 via the fixing member 18*a*. At that time, the communication module 10 is arranged such that the principal surface 22*a* of the circuit board 12 and the principal surface 50*a* of the mother board 50 face each other. The top plate 20*a* of the metal case 20 mounted on the principal surface 22*a* of the circuit board 12 is mounted on the principal surface 50*a* of the mother board 50 via a heat dissipation member 60.

In addition, a ground electrode 52 is provided on the other principal surface 50*b* of the mother board 50. The mother board 50 includes a through hole 54 to enable insertion of the fixing member 18*a* of the connection member 18 therethrough. Therefore, the fixing member 18*a* is mounted so as to extend through the mother board 50, and another end of the fixing member 18*a* is electrically connected to the ground electrode 52 located on the other principal surface 50*b* of the mother board 50.

With regard to the electronic apparatus 140 including the wireless communication module 10 according to the first preferred embodiment, heat generated in the electronic component element 14 is dissipated as follows. Specifically, the heat generated in the electronic component element 14 is efficiently absorbed by the heat dissipation member 30, since the heat dissipation member 30 is preferably made of the resin having a high thermal conductivity. The heat absorbed by the heat dissipation member 30 is subsequently transferred to the first metal case 20. At the same time, the heat generated in the electronic component element 14 is transferred to the fixing member 18*a* arranged near the electronic component element 14. Then, the heat is transferred to the mother board 50 or the ground electrode 52 located on the other principal surface 50*b* of the mother board 50, each of which is a component to which the fixing member 18*a* is connected. At the same time, the heat that is generated in the electronic component element 14 and transferred to the metal case 20 is transferred to the mother board 50 via the heat dissipation member 60.

According to the electronic apparatus 140 including the wireless communication module 10 according to a preferred embodiment of the present invention, the same advantageous effects as those of the electronic apparatus 40 described above are provided, and the following advantageous effects are also provided. Specifically, according to the electronic apparatus 140 including the wireless communication module 10 according to a preferred embodiment of the present invention, it is possible to lead heat via the heat dissipation member 60 to the mother board 50, and thus it is possible to further enhance the heat dissipation effect.

In the wireless communication modules 10, 110, and 210 according to the preferred embodiments described above, the metal cases 20, 120, and 220 are preferably mounted on the circuit boards 20 to protect the electronic component elements 14 and the like, but the present invention is not limited thereto. In the present invention, the metal cases 20, 120, and 220 may not be mounted.

In addition, in the wireless communication module 10 according to the preferred embodiments described above, particularly, the heat dissipation member 30 is preferably arranged on the top surface of the electronic component element 14 which generates heat, but the present invention is not limited thereto. In the present invention, the heat dissipation member 30 may not be arranged on the top surface of the electronic component element 14.

Furthermore, in the wireless communication modules 10, 110, and 210 according to the preferred embodiments described above, the fixing member 18*a* and the connection connector 18*b* are included as the connection member 18, but the present invention is not limited thereto. Only the fixing member 18*a* may be mounted, or only the connection connector 18*b* may be mounted.

In addition, in the electronic apparatuses 40 and 140 each including the wireless communication module 10 according to the preferred embodiments described above, the wireless communication module 10 is preferably mounted on the mother board 50, but the present invention is not limited thereto. The wireless communication module 110 or 210 may be mounted on the mother board 50, for example.

Furthermore, in the electronic apparatus 140 including the wireless communication module 10 according to the preferred embodiments described above, the heat dissipation member 60 preferably is arranged on the top surface of the metal case 20, but the present invention is not limited thereto. In the present invention, the heat dissipation member 60 may not be arranged on the top surface of the metal case 20.

The composite module according to various preferred embodiments of the present invention and the electronic apparatus including the same are suitably used, particularly, for an electronic component that is used in, for example, a cellular phone or a wireless communication apparatus in a wireless LAN or the like and in which an electronic component element is mounted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite module comprising:

a circuit board;

an antenna and a connection member mounted on a mounting surface of the circuit board;

an electronic component mounted on the circuit board; and a metal case mounted on the circuit board so as to cover the electronic component; wherein the antenna is mounted in a region along a first end edge of the circuit board;

the connection member is mounted in a region along a second end edge of the circuit board;

the metal case and the electronic component are positioned between the antenna and the connection member;

the first end edge and the second end edge are opposed to each other when the circuit board is seen in a planar view; wherein the connection member includes at least a fixing member;

the metal case is mounted in a region on the second end edge side of the circuit board;

the metal case includes a top plate and a side plate arranged at a predetermined position;

the fixing member is arranged near a portion where the side plate is not arranged; and the fixing member is arranged such that the fixing member is covered with the metal case.

2. The composite module according to claim 1, wherein a heat dissipation member is arranged between the metal case and the electronic component.

3. The composite module according to claim 1, wherein the electronic component is one of a wireless communication IC, a balun filter, and a band-pass filter.

4. The composite module according to claim 1, wherein the circuit board includes a through hole to enable insertion of the fixing member.

5. The composite module according to claim 1, wherein the electronic component is mounted adjacent to the fixing member.

6. The composite module according to claim 1, wherein the antenna is a chip antenna including a dielectric material or a pattern antenna including a wiring pattern on the circuit board.

7. The composite module according to claim 1, wherein the side plate includes a plurality of side plates arranged at the predetermined position;

in side portions of the metal case, gaps are located at portions where no side plates are provided; and the fixing member is arranged to block at least one of the gaps.

8. The composite module according to claim 1, wherein the side plate includes a plurality of side plates arranged at the predetermined position; and the metal case is L-shaped or substantially L-shaped.

9. An electronic apparatus comprising:

a mother board; and the composite module according to claim 1, on the mother board.

10. The electronic apparatus according to claim 9, wherein the metal case or the mounting surface is mounted so as to face a principal surface side of the mother board.

11. The electronic apparatus according to claim 10, wherein a heat dissipation member is arranged between the top plate of the metal case and a principal surface of the mother board.

12. An electronic apparatus comprising:

a mother board; and the composite module according to claim 1, the composite module being mounted on the mother board via the fixing member.

13. The electronic apparatus according to claim 12, wherein the metal case or the mounting surface is mounted so as to face a principal surface side of the mother board.

14. The electronic apparatus according to claim 13, wherein a heat dissipation member is arranged between the top plate of the metal case and a principal surface of the mother board.

15. The electronic apparatus according to claim 1, wherein the fixing member is electrically connected to ground.

* * * * *